US006557151B1

(12) United States Patent
Donath et al.

(10) Patent No.: US 6,557,151 B1
(45) Date of Patent: Apr. 29, 2003

(54) DISTRIBUTED STATIC TIMING ANALYSIS

(75) Inventors: Wilm E. Donath, New York, NY (US); David J. Hathaway, Underhill Center, VT (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 09/650,399

(22) Filed: Aug. 29, 2000

Related U.S. Application Data

(63) Continuation of application No. 09/004,813, filed on Jan. 9, 1998, now Pat. No. 6,202,192.

(51) Int. Cl.[7] .............................. G06F 17/50; G06F 9/45
(52) U.S. Cl. ........................................... 716/6; 716/4
(58) Field of Search ...................................... 716/6, 4

(56) References Cited

U.S. PATENT DOCUMENTS

| | | | | | |
|---|---|---|---|---|---|
| 4,263,651 A | * | 4/1981 | Donath et al. | ............... | 364/300 |
| 4,709,347 A | * | 11/1987 | Kirk | ..................... | 364/900 |
| 4,736,393 A | * | 4/1988 | Grimes et al. | ............... | 375/107 |
| 5,003,487 A | * | 3/1991 | Drumm et al. | .............. | 364/489 |
| 5,095,454 A | * | 3/1992 | Huang | ........................ | 364/578 |
| 5,355,321 A | * | 10/1994 | Grodstein et al. | .......... | 364/489 |
| 5,365,463 A | * | 11/1994 | Donath et al. | ............... | 364/578 |
| 5,502,730 A | * | 3/1996 | Roy et al. | .................. | 371/22.3 |
| 5,508,937 A | * | 4/1996 | Abato et al. | ................ | 364/488 |
| 5,602,754 A | * | 2/1997 | Beatty et al. | ............... | 364/489 |
| 5,648,909 A | * | 7/1997 | Biro et al. | .................. | 364/488 |
| 5,657,239 A | * | 8/1997 | Grodstein et al. | .......... | 364/488 |
| 5,696,694 A | * | 12/1997 | Khouja et al. | .............. | 364/488 |
| 5,923,564 A | * | 7/1999 | Jones, Jr. | .................... | 364/489 |

OTHER PUBLICATIONS

H.C. Yen et al., A Path Selection Algorithm for Timing Analysis, 25th ACM/IEEE Design Automation Conference, pp. 720–723, Jun. 1988.*
C. Jeong et al., Performance Evaluation of Multithreading in Concurrent Programs, Proceedings IEEE, SoutheastCon, 2002, pp. 7–9, Apr. 2002.*

* cited by examiner

Primary Examiner—Matthew Smith
Assistant Examiner—A. M. Thompson
(74) Attorney, Agent, or Firm—Connolly Bove Lodge & Hutz; H. Daniel Schnurmann

(57) ABSTRACT

A method of distributed timing analysis for a network which has been partitioned into at least two partitions, with each partition being assigned to a separate timing analysis process which communicates with the other processes is provided. A depth first search is performed by the process assigned to the partition in which the node for which timing information is desired is located. When the depth first search encounters a node for which a timing value is required which is located in another partition, a request is immediately sent to the process corresponding to that partition for the required timing information. When the request for timing information from the other partition is answered, the associated node is placed in the propagation queue. Also, as a node is processed, successor nodes which have had their predecessors processed are added to the propagation queue. The nodes in the propagation queue are processed and timing values are computed. When there are no nodes in the propagation queue, global loop detection is performed. Additionally, incremental timing updates are performed when a change is made in the network.

17 Claims, 7 Drawing Sheets

DISTRIBUTED STATIC TIMING ANALYSIS

CROSS-REFERENCE TO RELATED PATENTS

The following commonly assigned patent application is a continuation application to U.S. patent application Ser. No. 09/004,813, filed on Jan. 9, 1998, and now issued as U.S. Pat. No. 6,202,192.

DESCRIPTION

1. Technical Field

The present invention relates generally to the field of static timing analysis of logic circuitry, and more particularly to a method of distributed static timing analysis for a network which has been partitioned into at least two partitions with each partition being assigned to a separate timing analysis process.

2. Background of Invention

Static timing analysis may be applied to a logic circuit to determine if it meets predetermined specifications. Two broad classes of static timing analysis methods are known, path oriented and block oriented. The path oriented method traces each path through the logic network and computes the arrival times at nodes separately for each path. These methods often take a long time to complete as the number of paths in a network can rise exponentially with the size of the network. The number of paths referred to in a timing analysis can be pruned down, but this cannot always be done perfectly and some paths may be missed. In block oriented methods, the arrival times at nodes other than the primary inputs are computed only once, as the maximum, over all in-edges of the in-edge source arrival time plus the logic circuit delay. This method gives much better control over the run time of the analysis, and is the preferred approach.

In the block oriented methods, there are two techniques which are commonly used to control the order of the initial arrival time calculation. One technique requires that the network be levelized so that each node is assigned a number which is greater than that of the nodes which precede it. The arrival times are then computed in the order of the level of the node. When using this technique, another method must be used in order to detect loops in the network.

The second technique performs a recursive depth first search (DFS) from the point where an arrival time is requested. The current invention is based on a block oriented method using this latter technique. The arrival times for a node are computed when all predecessor nodes have had their arrival times computed. If a node is encountered for which an arrival time has already been computed, the DFS along that branch is terminated and the stored arrival time is used. If no arrival time is present, the in-edges of he delay graph are looped through and a request is made for the source arrival time and the logic circuit delay. These are added and the maximum sum is used as the arrival time at the node. The DFS can also detect and cut local loops. Although the above described methods work well in certain situations, they are not without limitations.

Design of logic networks is becoming increasingly complex and may include thousands of logic elements and many interconnections between the elements. As a result, actually performing a static timing analysis in one of the above described ways cannot be done efficiently as the analysis may become too large to be held in memory, run too slowly on one processor, or require too many resources.

U.S. Pat. No. 5,602,754 to Beatty et al. proposes a method to solve these problems. This method partitions the network in some manner. Each partition of the network is then assigned to a separate timing analysis process, each of which may be running on separate computers. Communications are established between the processes in order to exchange data therebetween. This allows the complex task of timing analysis to be processed in parallel by the separate processes, thereby increasing the system performance.

However, the method in Beatty has several limitations. It is not able to handle global loops in the network, i.e., a loop between two or more of the partitions. Global loops are becoming increasingly common with the use of transparent single-latch designs. If the method of Beatty et al. encounters a global loop, it gets into an infinite recursion loop, i.e., the analysis fails. Also, Beatty et al. does not handle inexact synchronization between portions of a distributed timing analysis process. Additionally, Beatty et al. cannot perform incremental initial timing analysis. As described, Beatty et al. always performs an analysis on the entire network, even when only a subset of the timing information is needed.

There is a need for a method of static timing analysis which can be distributed to run on several processors in parallel, which can detect and cut global loops, and which can perform incremental initial timing analysis and timing updates on a portion of the logic network.

SUMMARY OF THE INVENTION

The invention comprises a method of distributed timing analysis for a network which has been partitioned into at least two partitions, with each partition being assigned to a separate timing analysis process which communicates with the other processes. In accordance with one embodiment, a request is made for timing information at a node in the logic network and a Depth First Search (DFS) is performed from the requested node. This is done in a known manner and the loops which are local to a process, i.e. within a given partition, are detected and cut. Local primary inputs with known timing values are added to a propagation queue. A request to other processes, i.e. for other partitions is issued in order to process nodes which require timing information from other partitions. When a request for timing information from another partition is answered, the associated node is placed in the propagation queue. Each node in the propagation queue is processed and a timing value is computed for it. As a node is processed, those of its successors which have had all their predecessors processed are added to the propagation queue. This continues until a timing value is computed for the requested node and is returned to the requester.

According to another embodiment of the invention, global loops which exist between the partitions are detected and cut as follows. Each process generates an input/output (I/O) connection map for its partition listing each input/output pair between which a path exists in the partition. This I/O map is then communicated to each neighboring partition. Each neighboring partition receives an I/O map from its neighboring partitions and merges these with its own I/O map, which is then passed on, and so on. Each process checks the I/O maps it receives and when it receives a map which includes some of its own inputs or outputs, it determines whether these connections result in a global loop. The processes then negotiate with each other to determine the best place to cut the loop. Thereafter, the DFS may continue as already described.

In another embodiment of the present invention, a method is provided which can provide updated timing value information for the network after changes have been made to the network. This is done using the most current available information from all the other processes. A global request is transmitted to all processes to process their timing queues up to the necessary level and send the information to each partition subject to change.

In another embodiment, the updated timing values may be generated using the most current information already received from the other processes without waiting for other information which has not yet been propagated. This is done by having the processes send unrequested updates to processes which depend on them for values.

BRIEF DESCRIPTION OF THE DRAWINGS

The present invention will now be further described in the following pages of the specification taken in conjunction with the attached drawings, in which.

DETAILED DESCRIPTION OF THE INVENTION

The present invention provides a method for efficiently carrying out static timing analysis on a logic network. The logic network comprises a number of logic elements which are interconnected. The network is first partitioned into at least two partitions, with each partition being assigned to a separate timing analysis process. The processes may in general be running on separate computers. An example of how the network is partitioned, the partitions are assigned to processes and communication channels are established between the processes is found in U.S. Pat. No. 5,602,754 to Beatty et al.

Figure 7:
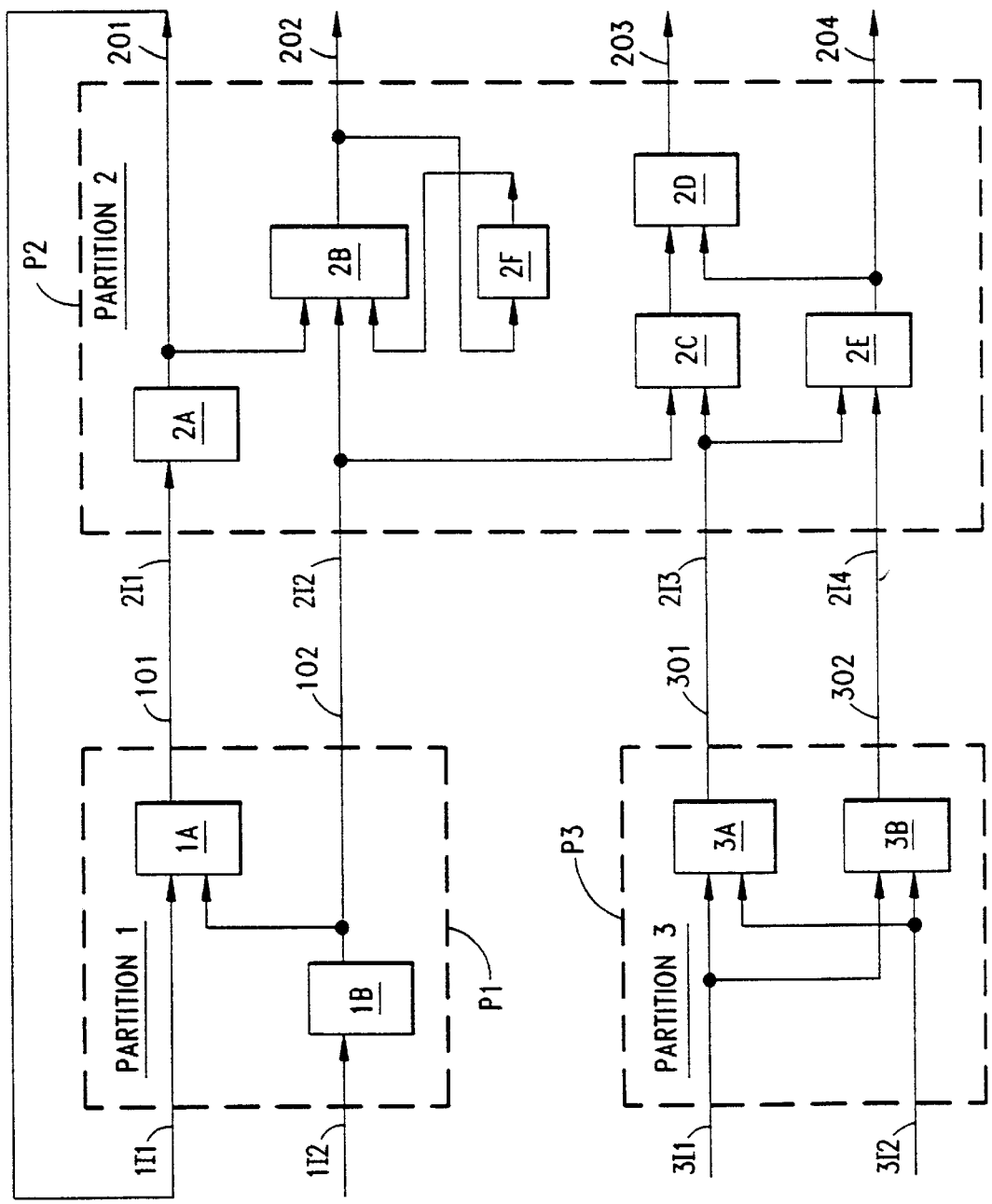
FIG. 7 is an example of a logic network suitable as the subject of a timing analysis by the method of the present invention.

An example of a logic network on which the method of the present invention could be used is shown in FIG. 7. The network has been partitioned into three partitiones, P1–P3. Each partition contains a number of blocks which have been labeled with the partition number and a letter, for example, in P1 the blocks are labeled 1A and 1B. Each block represents a circuit element, the important characteristic in terms of a timing analysis is the time delay through the element. Each partition also has a number of inputs and outputs, for example, inputs 1I1 and 1I2 and outputs 1O1 and 1O2 for partition 1. Each of the blocks in the partition also has a number of inputs and outputs which may be connected either to other blocks in the same partition or to a separate partition. The block inputs and outputs are designated by the block name, a period, an "I" or "O" for inputs or outputs, respectively, and a number indicating the position of the input or output on the block. For example, the first and second inputs of block 2B are designated 2B.I1 and 2B.I2, respectively. Also note that the network of FIG. 7 has a local loop in partition 2 between blocks 2B and 2F consisting of 2B.O1, 2F.I1, 2F.O1, and 2B.I3. Additionally, a global loop exists through partitions 1 and 2; as seen by tracing 1O1 to 2I1 to 2O1 to 1I1 to 1O1. The entire network has primary inputs 1I2, 3I1 and 3I2 which will have externally asserted arrival times on them and primary outputs 2O2, 2O3 and 2O4 which will have externally asserted required arrival times.

To establish a timing analysis method for the network of FIG. 7, assume that a timing analysis process (which is described in detail in the following portion of this specification) is established for each of the partitions.

Figure 1:
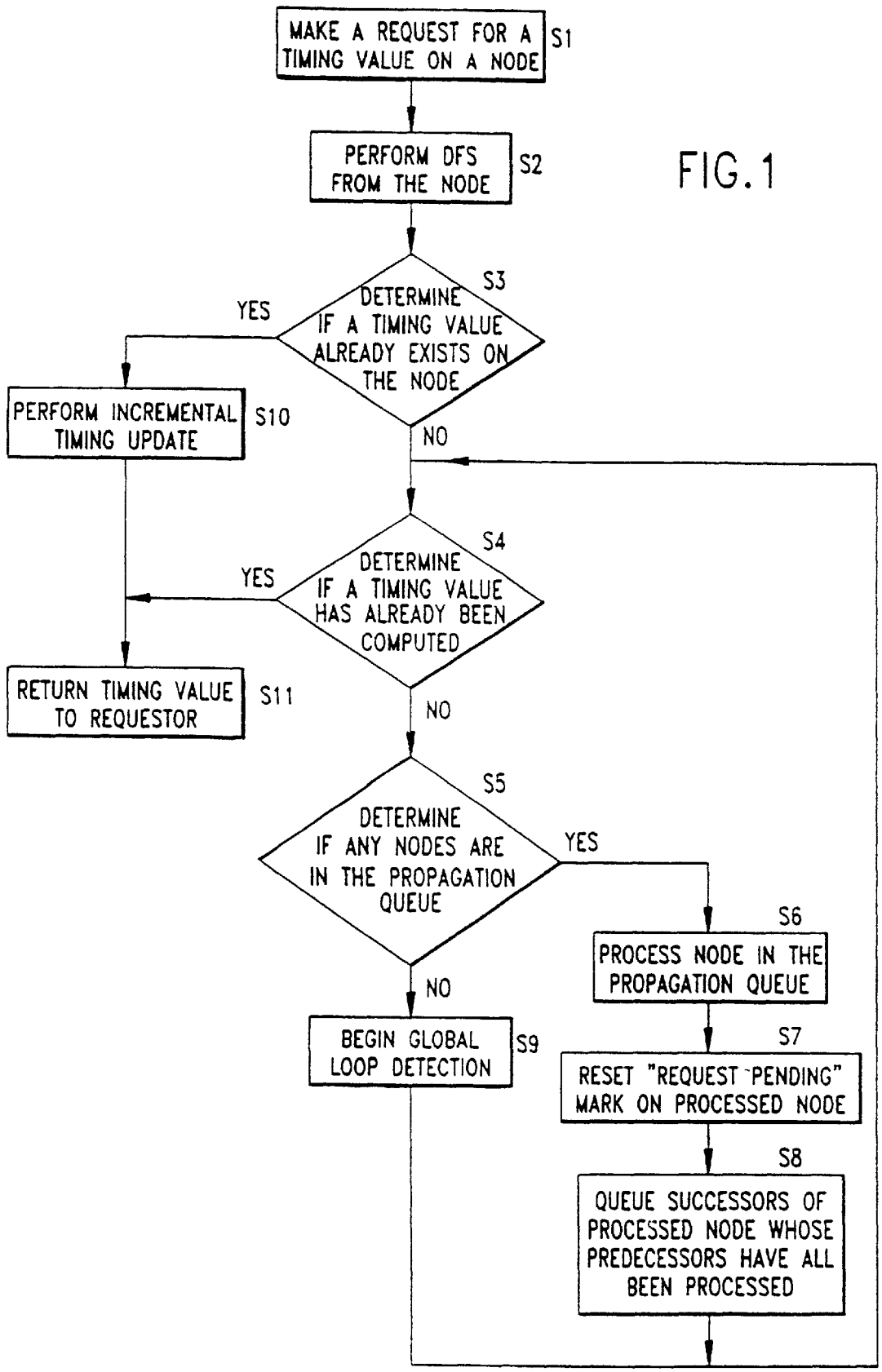
FIG. 1 is a flow diagram of a top level view of the method of the present invention.
Figure 2:
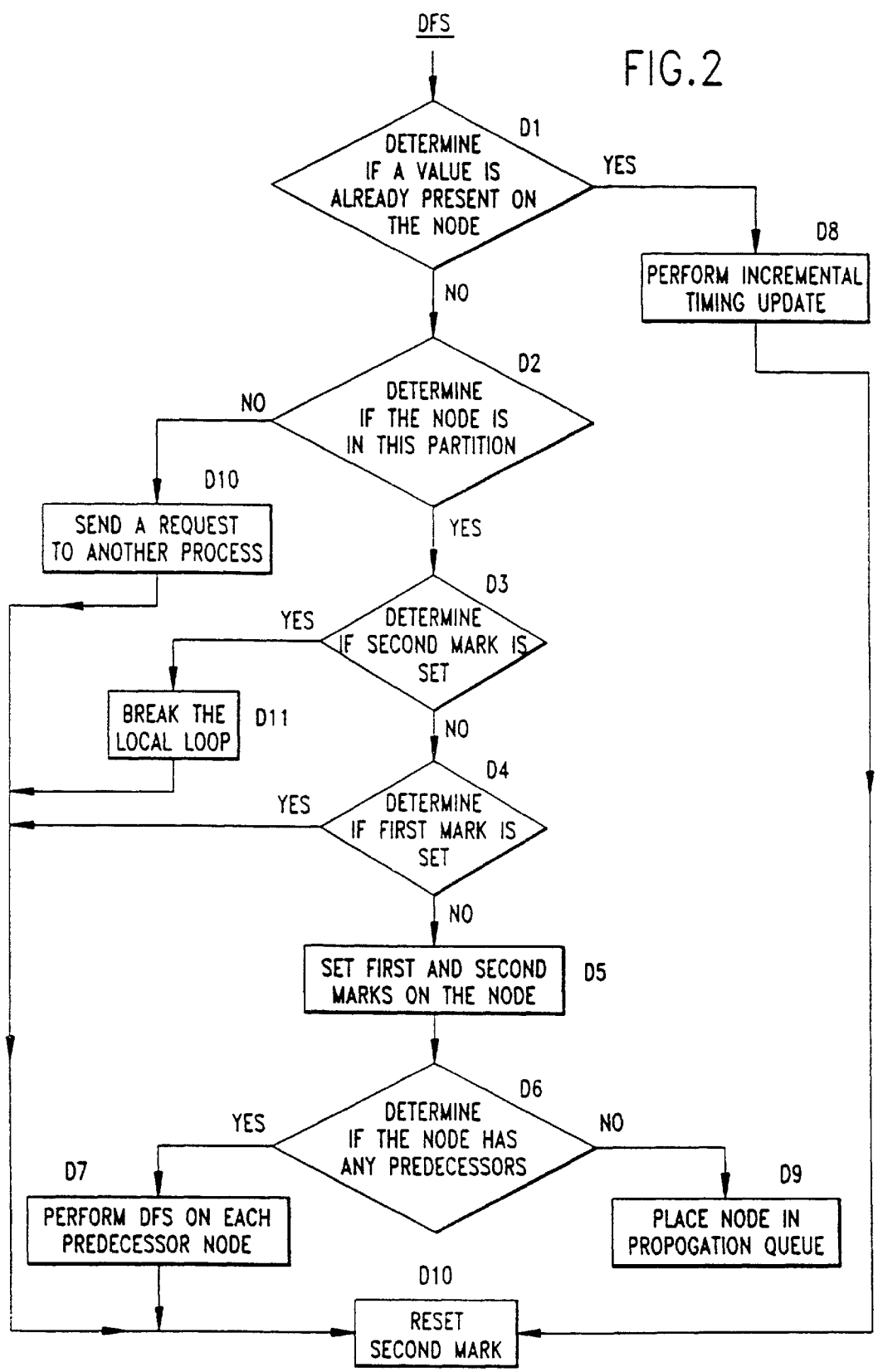
FIG. 2 is a flow diagram of the DFS request process for a node.
Figure 3:
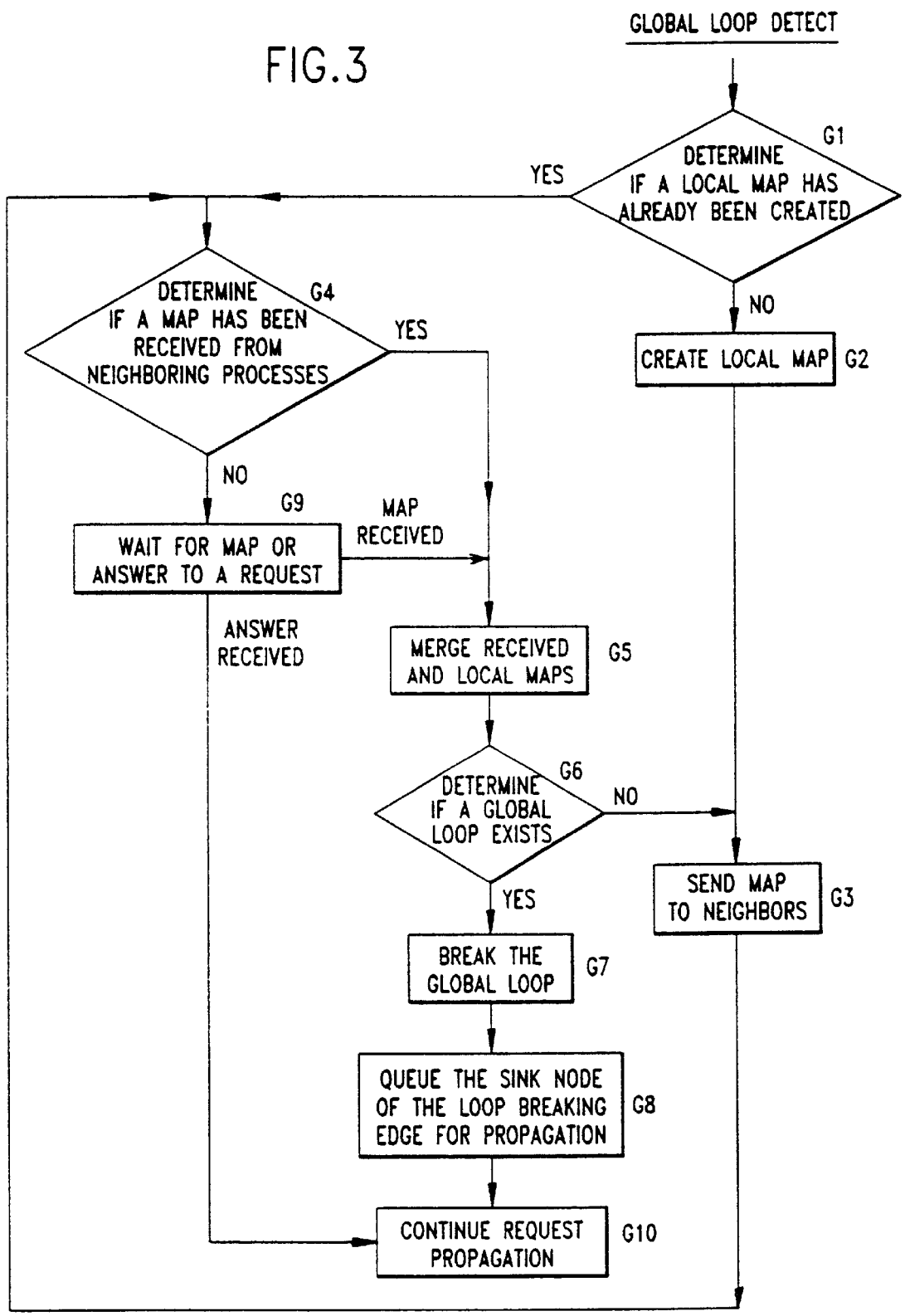
FIG. 3 is a flow diagram of the global loop detection procedure.
Figure 4:
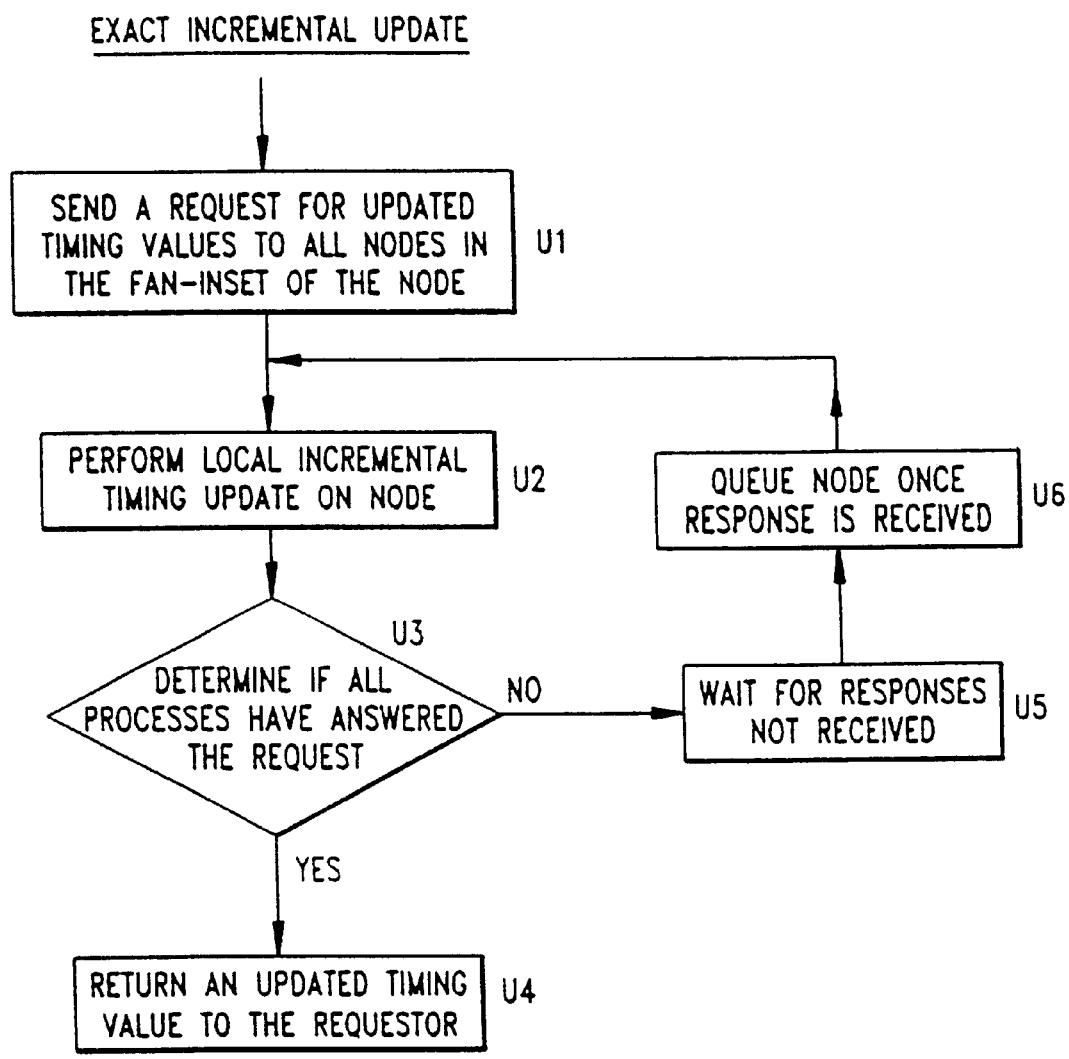
FIG. 4 is a flow diagram of the exact incremental update procedure.

First, an overall view of the distributed static timing analysis method of the present invention will be described with reference to FIG. 1 and then the details of the various steps will be described with reference to FIGS. 2–6. Each of FIGS. 2–6 illustrate in detail one of the steps of FIG. 1. Step S2 of FIG. 1 is shown in detail in FIG. 2, step S9 is shown in detail in FIG. 3. FIG. 4 is one alternate detail for step S10 of FIG. 1, the other alternate for step S10 is FIGS. 5 and 6. In each figure, there is an event which triggers the operation in that figure. In FIG. 1, the trigger event is a request for a timing value, referenced S1.

The requesting entity may be a human designer or another program attempting to optimize the network and wishing to monitor its progress. The requesting entity could also be a report generation system which requests timing values at all nodes in the network and generates a report summarizing them. Finally, the requesting entity could be a timing analysis process, similar to this one, effected on a different partition.

In response to the request, a depth first search (DFS) is performed according to Step S2 beginning from the node on which timing information has been requested, as seen in FIG. 1.

Step S3 then determines whether a value already exists on the requested node. If a value already exists on the node, the method proceeds to step S10 and an incremental update is performed on the node and an updated value is returned to the requester, step S11. Initially, there won't be a value on the node and the method will proceed to step S4 to determine if a value has previously been computed for the node. If this is the case, proceed to step S11 and return the updated value to the requestor. Again, initially there will not be a value computed on the node and the method would proceed to step S5 to determine if there are any nodes to be processed in the propagation queue. If there are, each node from the queue would be processed and a request pending mark would be reset, according to steps S6 and S7, respectively. The successors of the processed node whose predecessors have already processed would then be queued according to step S8 and the method would loop through again from step S4. If step S5 determines there are no nodes in the propagation queue, global loop detection is begun according to step S9. Global loop detection (see FIG. 3) continues until a further event. The flow of FIG. 1 is continued at S4.

The DFS of step S2 is performed in a well known manner and loops that are local to a process are detected and cut. As the depth first search progresses, nodes are marked with a first mark and the edges with a second mark the first time they are encountered. The first mark indicates that the node has a request for an arrival time pending, and the second mark indicates that the node is in the depth first search. The marking of the nodes prevents the retracing of the same branches of the fan-in cone multiple times and indicates to the subsequent propagation step, described below, the parts of the network along which it should propagate the timing values. The second mark is reset when the depth first search returns from recursion and the first mark is reset when the arrival time is computed for that node. When the DFS encounters an edge on which a second mark has already been placed, this indicates detection of a local loop, consisting of a set of edges possessing a second mark. An edge is then chosen from this set to break the loop. The DFS then returns from recursion to the sink node of the chosen edge, and the DFS continues. As the DFS progresses, nodes will either have timing values available or require values from other processes. As soon as a node is encountered which requires timing information from another partition, the depth first search issues a request to the corresponding process for the required timing information.

A propagation queue is provided and nodes which have timing information available are placed in the propagation queue. When a request to a corresponding process for timing information from another partition is answered, each associated node is then placed in the propagation queue. Successor nodes of processed nodes are checked to identify which nodes have had values for all their predecessor nodes processed and these identified nodes are then placed in the queue. After a node has been placed in the queue, a timing value is determined for that node. The nodes in the queue are processed as soon as the information needed to determine the timing arrival for that node is available, without waiting for other requests that may still be pending.

The above described DFS of step S2 will now be explained with reference to FIG. 2. Steps D1 and D8 are optional and relate to an incremental timing update. If a value is already present on the node, an incremental timing update is performed according to D8, the second mark is reset, step D12, and the DFS is complete. Initially, there will not be a value present on the node and the DFS would proceed to step D2 and determine which partition the requested node is in. If the node is not in the partition in which the DFS is being executed, a request is sent to another process according to step D10, the second mark is reset, step D12, and the DFS is complete in this process for that node. If the node is in this partition, it is determined whether the second mark is set according to step D3. If the second mark is set, this indicates that a local loop has been detected and the loop is broken according to step D11. If the second mark is not set, the DFS proceeds to step D4 and it is determined whether the first mark has been set on this node. If this is the case, this request has already been taken care of and the DFS does not need to proceed any further. Therefor, the second mark is reset, step D12, and the DFS ends. If neither the first or second marks are set on the node, both marks are then set in accordance with step D5 and it is determined whether the node has any predecessors in accordance with step D6. If the node does not have any predecessors, it is ready for processing so it is immediately placed in the propagation queue according to step D9. If the node does have predecessors, then a DFS is performed on each of the predecessor nodes according to step D7. After either of steps D7 and D9, the DFS is complete so the second mark is reset, step D12, and the DFS is exited.

The above described method can be used independently when the logic network has already had global loops cut. However, it may be the case that the network is partitioned in such a manner that global loops exist between the partitions. This is shown, for example, in FIG. 7 where the input 1I1 of partition 1 requires the output 2O2 from partition 2. When a global loop exists, the value propagation steps S6, S7 and S8 of FIG. 1 are unable to proceed because all processes in the global loop would be waiting for their predecessors to return a value to them. When any process detects that it is unable to continue (see FIG. 1, step S5—no values computed and no nodes in the queue), the flow proceeds to detect global loops as described below. This activity suspends whenever new values are received allowing the process to continue propagation.

The method of detecting global loops will be described with reference to FIG. 3. Each process generates an I/O map, listing each input/output pair between which a path exists in the partition, steps G1 and G2, and communicates its map with neighboring processes, step G3. For example, partition 2 would communicate its I/O map with both partitions 1 and 3, while partition 3 would communicate its map with partition 2 only. After each process receives an I/O map from its neighbors, step G4, it combines this map with its own, step G5. If a map has not been received from the neighbors, the process waits, step G9, until a map is received and then proceeds with step G5, or until an answer to a request is received and then proceeds with step G10. When a process receives a map which includes some of its own inputs or outputs, it determines whether these connections form a loop, step G6. The processes then negotiate in order to determine the best place to break the loop, step G7. After the loop is broken, the sink node at the loop breaking edge is queued for propagation in accordance with step G8 and request propagation would continue per step G10. If no loop is found, step G6 proceeds to step G3 and the combined map is then passed on to neighboring processes, and the method continues from step G4. For example, partition 2 combines its map with the received map from partition 3, which is then sent to partition 1.

The size of the I/O maps can become very large for partitions with many inputs and outputs. One embodiment of the present invention accounts for this problem by discarding from the I/O map of a process any inputs for which arrival time values have been received and any output for which required arrival time values have been received. Since timing values have been received for these nodes, they cannot be included in any global loops. Omitting them from the I/O maps will reduce the time and memory required for global loop detection. Additionally, input or outputs for which no arrival time or required arrival time request, respectively, is pending may also be discarded from the I/O map. These nodes may be involved in loops, but these loops do not need to be broken in order to fill any of the pending value requests.

Another way of keeping the size of the I/O map small is to order the input/output pins in a manner so that pin ranges can be used in the I/O maps. In this embodiment, each input pin is given a unique consecutive number. This number forms the low order bits of the final pin number. It is then determined how many unused bits remain in the pin number. For example, if there are 1,000 inputs, numbering them would take 10 bits and 22 bits would remain in a 32 bit index. For a process having N outputs, assign one of N bit positions to each of the N outputs and propagate N bits back from the outputs to inputs, computing the N bits for each node by ORing the corresponding bits of all its successors until N bits are obtained on each input, indicating which outputs it feeds. Next, the outputs are sorted by the number of inputs that feed them. This can be determined for a particular output by counting a number of inputs which have that output bit set. The number of unused index bits, M, is determined and M inputs are selected. An unused index bit is assigned to each of these inputs with the most significant bit being assigned to the input feeding the most outputs, the second most significant bit going to the input feeding the second most outputs and so on. The high order bits of each input index are set based on which outputs it feeds. The highest order bit of an input index is set to one if the input feeds the corresponding output. The other high order bits are set to the opposite value of the bit one order higher when the input feeds the corresponding PO, and to the same value as that bit when it does not.

This insures that the two outputs fed by the most inputs have the paths to them represented by a single range. The output fed by the next highest number of inputs needs only two ranges, and so on. A similar process may be used to index the outputs if it is desired to use ranges on both sides of the map.

The chart shown below illustrates an example of range creation. Each row corresponds to at least one input and the ordering of the rows is imposed by the index bit assignments. Each vertical group of "y" indicates a range of inputs feeding the associated output.

| feeds PO 1 | MSB | feeds PO 2 | 2nd MSB | feeds PO 3 | 3rd MSB |
|---|---|---|---|---|---|
| N | 0 | N | 0 | N | 0 |
| N | 0 | N | 0 | Y | 1 |
| N | 0 | Y | 1 | Y | 0 |
| N | 0 | Y | 1 | N | 1 |
| Y | 1 | Y | 0 | N | 0 |
| Y | 1 | Y | 0 | Y | 1 |
| Y | 1 | N | 1 | Y | 0 |
| Y | 1 | N | 1 | N | 1 |

In order to optimize the processing time, it is recommended that the I/O map be created whenever a process is waiting for a request to be answered from it neighboring process, which may never arrive because of the existence of a global loop. The creation of the I/O map would be suspended whenever a new value is returned to a process and would be stopped when all pending requests have been satisfied, indicating that the process is not involved in any global loops. After the global loops encountered have been cut, the DFS can continue until a timing value for the requested node is returned The results can then be evaluated to determine if the design meets the required specifications.

After initial timing values have been computed for a logic network, either as described above or by a different method, the design of the network may be changed in one or more of the partitions. Each of the changes may be composed of a number of smaller constituent changes. For example, inserting a buffer would involve disconnecting a block from one or more of its sink nodes, adding the buffer, connecting the block to the buffer input, adding a new node, connecting the new node to the buffer output and connecting the new block to each of the sink nodes which the original block was disconnected. Each of these changes causes a change to the network delay graph, but the network is not in a consistent state until all of these constituent changes of the larger change have been made.

The timing information needs to be updated in order to monitor the effect of the changes on the timing values in the network. There are several alternatives to consider on how to perform the update, taking into account how current the timing values within a process need to be. The computation of the updated timing values may be done using either a) using the most current available information from all the other processes or b) using the most current information already received from the other processes without waiting for other information which has not yet been propagated.

In alternative a) mentioned above, shown in FIG. 4, a request must be made to all other processes in the fan inset of the node for up to date timing values, step U1. Then, an incremental timing update can be performed in the partition to update the timing values and take into account the changes, as shown in step U2. The incremental timing update may be done by the method disclosed in U.S. Pat. No. 5,508,937 to Abato et al. or some other incremental timing update method. It must then be determined that all requested values have been received before the necessary changes can be made in the network, step U3. If all processes have answered the request, proceed to step U4 and return a value. Otherwise, wait for a response per step U5 and, once a response is returned, the responding node is queued according to step U6 and the method continues with step U2.

The up-to-date timing information can be obtained by transmitting a global request to all other processes to process their queues up to the necessary level. However, this may cause more work and waiting than necessary.

The number of requests made to other processes may be limited by using a bit flag method. A first option involves assigning a bit flag to each process which immediately feeds the input of the process for the partition subject to change. The inputs from each process are marked with the appropriate bits which would then be propagated. Requests for updated timing values are then only sent to those processes whose bits are set on the node. The processes whose bits are set may themselves depend on other processes for their timing values and they would then need to send a request of their own for updates from any process on which any of their outputs depend. Alternatively, in a second option, a bit flag may be assigned to each process in the entire distributed timing procedure. These bits would then be propagated and an OR function would be performed with the bit for the current process when it propagates its timing values to the other processes. When a timing request is made at a node, requests for updates are then sent to all processes whose bits are set on the node.

Each of these options has its own advantages. In the first option, there will tend to be fewer immediate predecessor processes than there are processes in the entire distributed timing analysis. This means that it will be less likely to share the bit flags between different predecessor processes. The advantage of the second option is that all requests can be made directly rather than requiring the requests to follow a path back through the predecessor nodes. Also, because in the first option, the specific predecessors recorded in the bit flags on each output are not transmitted to its successors in other processes, it is necessary to make requests to earlier processes which have paths to some of the outputs of the predecessor, but not to the outputs that are needed. In either case, it is not necessary to wait for the predecessors to finish their updates. Each process will handle its queue in parallel, transmitting the timing updates to its neighboring processes as they are computed.

If the application requesting the timing values can make simultaneous unsynchronized changes in the portions of the network in different processes, the updates may be performed as in alternative b). There are three aspects to this alternative:

1) Not waiting for updates from other processes, using anything received, but not requesting and waiting for new updates. This requires having the other processes sent unrequested updates to processes which depend on them for values. These unrequested updates are processed according to FIG. 6, as described below.

Figure 5:
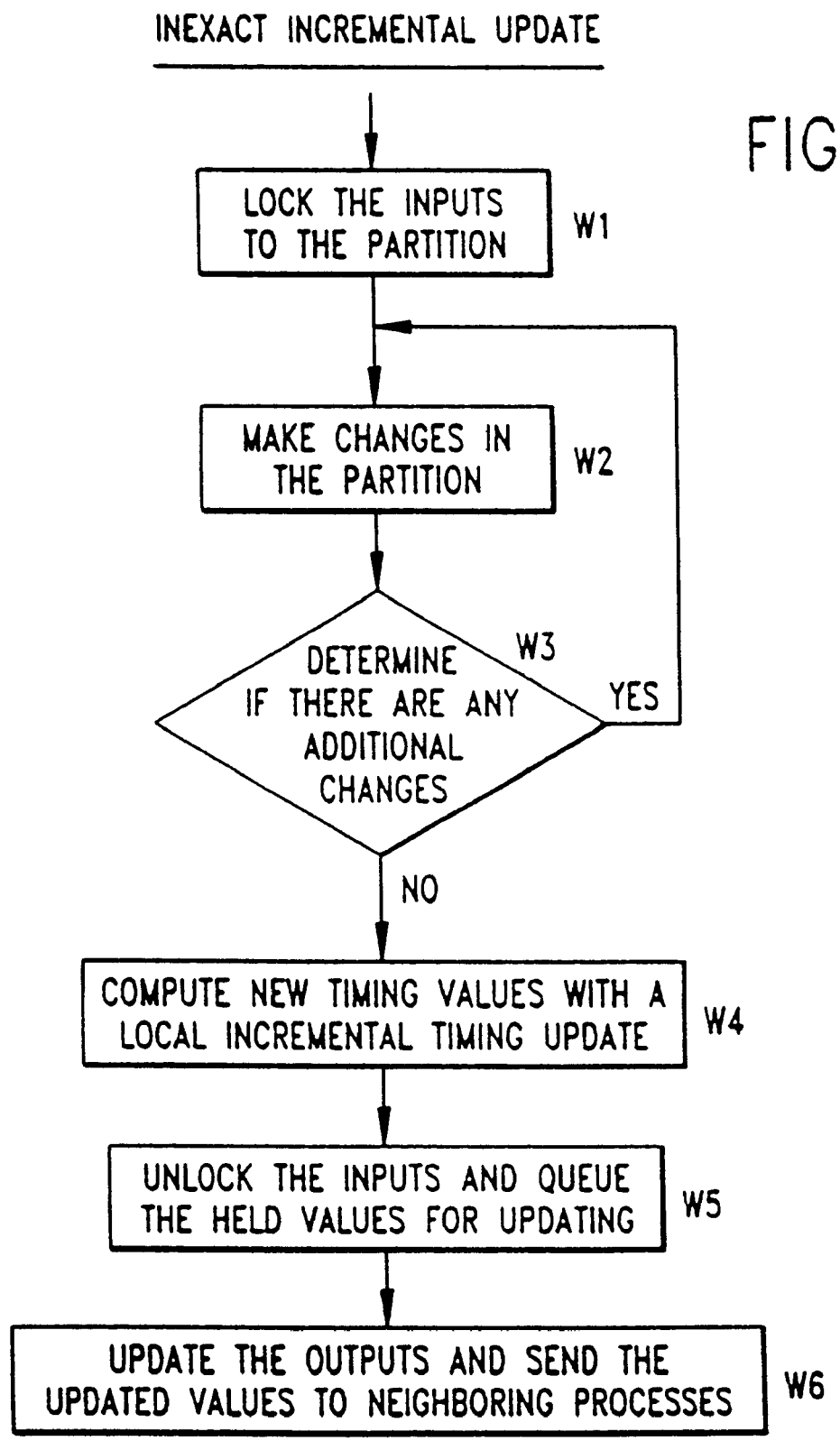
FIG. 5 is a flow diagram of the inexact incremental update procedure.

2) Suspending updates from other processes for a period of time so comparisons can be made of the timing values before and after a local change is made without being contaminated by concurrent changes made in other processes. This procedure is shown in FIG. 5. Here, before the changes are made in a partition, in accordance with step W1, a lock is placed on the inputs of the process. Both a current and a pending value at inputs fed from other processes is stored. The change is made to the partition, steps W2 and W3, and an incremental timing update is performed to determine the effect of the change, per step W4. The lock on timing is then released and pending values are copied into the current position and queued for processing, step W5, and partition output values are updated and sent to neighboring process which depend on them for values, step W6.

Figure 6:
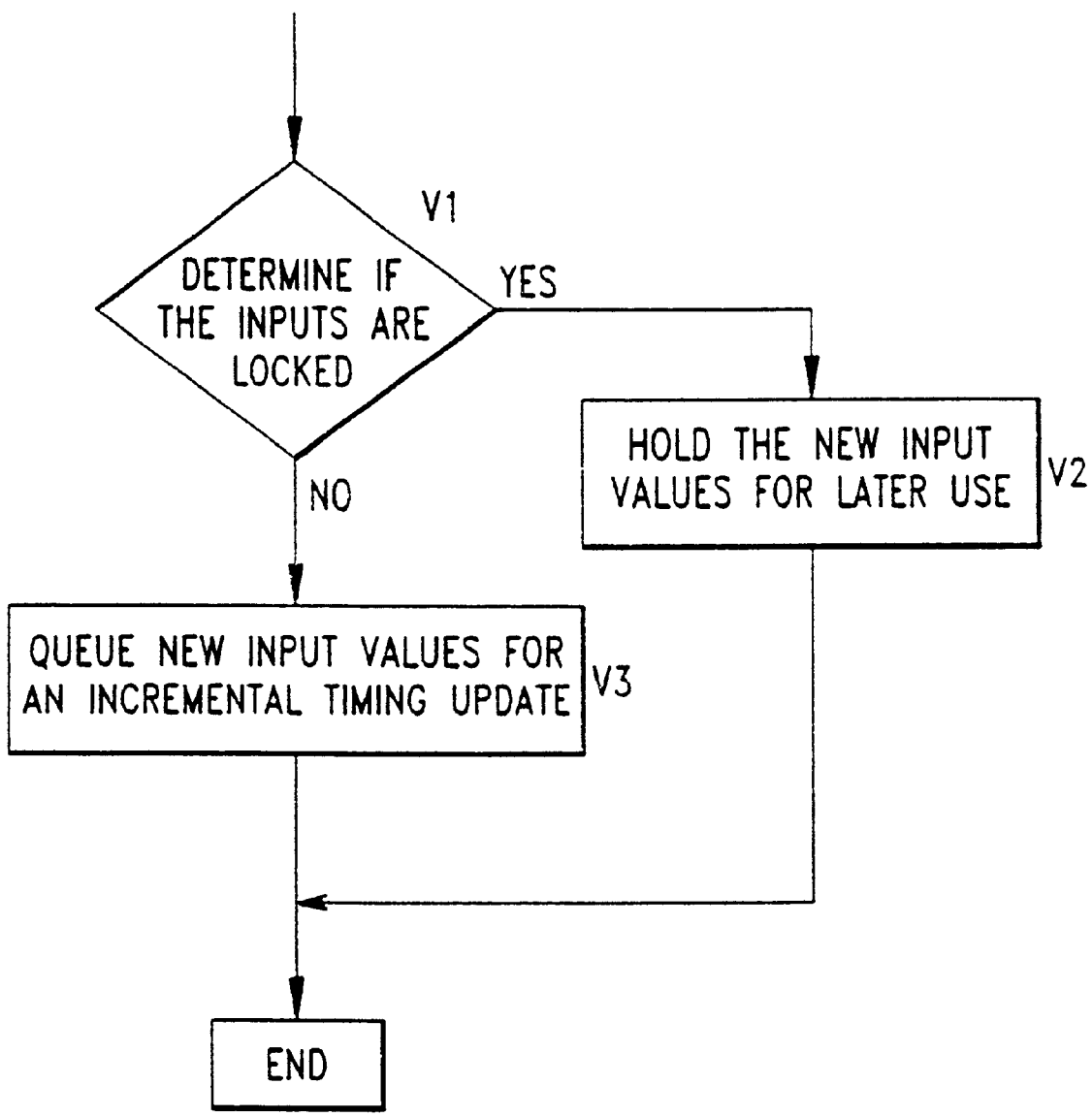
FIG. 6 is a flow diagram of an improvement to the inexact incremental update procedure.

It is possible that while the above described update is occurring, a new primary input value is received from another process. The procedure for handling this is shown in FIG. 6. First, it must be determined if the inputs are locked, step V1. If they are, step V3 queues the new values for updating by the incremental timing update method. Otherwise, per seep V2, the new input value is held for later use.

3) Suspend sending updates to other processes until the proposed change has been made and evaluated so that other processes are not contaminated by intermediate results. This is accomplished according to step W6 of FIG. 5, as described above.

In order to facilitate an understanding of the invention, an example of the operation of the method of the present invention will be given for the network shown in FIG. 7. The detailed process explained is graphically illustrated in the flow charts of FIGS. 1–6.

For simplicity, assume that all block delays are 1 and all net delays are zero. In a more general case each edge in the delay graph network would take on a different delay value. The arrival times (AT) computed will be for late mode timing analysis.

After the network has been partitioned and the partitions have been read in to corresponding processes, a request for timing information is made. Assume this is a request for an AT on 2O2. According to the first step of the present invention, a depth first search (DFS) is done to detect local loops and queue starting points for propagation. Two marks will be used: a first mark, "pending AT" set on nodes and a second mark "in DFS" set on edges. Both marks are set the first time a node is encountered. The "in DFS" mark is reset on return from recursion and the "pending AT" mark is reset when the AT value is computed for the node. The death first starts at 2O2 and proceeds as follows.

Each level of indentation is a recursive call.
In process 2:
Request on 2O2
   set "pending AT" on 2O2
Request on 2B.O1
   set "pending AT" on 2B.O1 and "in DFS" on 2B.O1–2O2
   Request on 2B.I1
     set "pending AT" on 2B.I1 and "in DFS" on 2B.I1–2B.O1
     Request on 2A.O1
       set "pending AT" on 2A.O1 and "in DFS" on 2A.O1–2B.I1
       Request on 2A.I1
         set "pending AT" on 2A.I1 and "in DFS" on 2A.I1–2A.O1
         Request on 2I1
           set "pending AT" on 2I1 and "in DFS" on 2I1–2A.I1
           send request R1 for value on 1O1 to process 1
           reset "in DFS" on 2I1–2A.I1
         reset "in DFS" on 2A.I1–2A.O1
       reset "in DFS. on 2A.O1–2B.I1
     reset "in DFS" on 2B.I1–2B.O1
Request on 2B.I2
   set "pending AT" on 2B.I2 and "in DFS" on 2B.I2–22.O1
   Request on 2I2
     set "pending AT" on 2I2 and "in DFS" on 2I2–2B.I2
     send request R2 for value on 1O2 to process 1
     reset "in DFS" on 2I2–2B.I2
   reset "in DFS" on 2B.I2–2B.O2
Request on 2B.I3
   set "pending AT" on 2B.I3 and "in DFS" on 2B.I3–22.O1
   Request on 2F.O1
     set "pending AT" on 2F.O1 and "in DFS" on 2F.O1–2B.I3
     Request on 2F.I1
       set "pending AT" on 2F.I1 and "in DFS" on 2F.I1–2F.O1
       Request on 2B.O1
detect that "in DFS" is already set on an in-edge of 2B.O1, indicating that this node has already been encountered during the DFS. Therefore a local loop exists in this partition. Trace back through edges with "in DFS" flag set to find a place to break the loop: choose edge 2F.I1–2F.O1 queue 2F.O1 for calculation by propagate phase

--- reset "in DFS" on 2F.I1 - 2F.O1
     reset "in DFS" on 2F.O1 - 2B.I3
   reset "in DFS" on 2B.I3 - 2B.O1
reset "in DFS" on 2B.O1 - 2O2

---

Note that as soon as timing information is needed from another partition, a request is sent to the corresponding process. In response to request R1, process 1 would begin a DFS from node 1O1. Optimally, process 1 would run in parallel with process 2 and would start its DFS from node 1O1 as soon as request R1 is received. The search would proceed as follows:

Request on 1O1
   set "pending AT" on 1O1
Request on 1A.O1
   set "pending AT" on 1A.O1 and "in DFS" on 1A.O1–1O1
   Request on 1A.I1
     set "pending AT" on 1A.I1 and "in DFS" on 1A.I1–1A.O1
     Request on 1I1
       set "pending AT" on 1I1 and "in DFS" on 1I1–1A.I1
       send request R3 for value on 2O1 to process 2
       reset "in DFS" on 1I1–1A.I1
     reset "in DFS" on 1A.I1–1A.O1
   Request on 1A.I2
     set "pending AT" on 1A.I2 and "in DFS" on 1A.I2–A.O1
     Request on 1B.O1
       set "pending AT" on 1B.O1 and "in DFS" on 1A.O1–1A.I2
       Request on 1B.I1
         set "pending AT" on 1B.I1 and "in DFS" on 1B.I1–1B.O1

Request on 1I2
  set "pending AT" on 1I2 and "in DFS" on
    1I2–1B.I1
  queue 1I2 for calculation by propagation phase
  reset "in DFS" on 1I2–1B.I1
  reset "in DFS" on 1B.I1–1B.O1
 reset "in DFS" on 1B.O1–2A.I2
 reset "in DFS" on 1A.I2–1A.O1
reset "in DFS" on 1A.O1–1O1

Process 1 would also perform a DFS from node 1O2 in response to Request R2 made by process 2. The DFS would proceed as follows:
Request on 1O2
  set "pending AT" on 1O2
  Request on 1B.O1
    set "in DFS" on 1B.O1–1O2
    detect that "pending AT" is already set on 1B.O1, so stop making requests here.
    reset "in DFS" on 1B.O1–1O2

Note that since the "pending AT" mark is already set on node 1B.O1, a request has already been made for timing information on 1B.O1 and all nodes in its fan-in cone. Therefore, it is not necessary to proceed any further with requests.

Next, process 2 would begin a DFS from node 2O1 in response to request R3 from process 1:
Request on 2O1
  set "pending AT" on 2O1
  Request on 2A.O1
    set "in DFS" on 2A.O1–2O1
    detect that "pending AT" is already set on 2A.O1, so do nothing
    reset "in DFS" on 2A.O1–2O1

Again, note that since the "pending AT" mark is set on node 2A.O1 it is not necessary to continue making requests.

All requests have now been made as soon as possible. Next, the propagation phase begins. In general any nodes queued for propagation during the DFS step may be processed as soon as the DFS for a given request completes. Thus, for example, after the DFS processing for the request on 2O2, propagation of the queued node 2F.O1 would probably begin before processing request R3. The DFSs are shown together here for simplicity.

An example of the propagation step is shown below. The level number assigned to the node and the fan-in set of the node are also shown with each computed node value. These will be used later during the incremental update phase. The level of a node with no predecessors, or for which all in-edges have been cut by loop cutting, is assigned level number 1. Assume AT's at these nodes are zero. Nodes with predecessors are assigned a level number which is one greater than the maximum level number of their predecessor nodes. The fan-in set of a node x will indicate the set of partitions which contain some other node Y such that an un-cut path exists from Y to X.

The propagation step would then begin in process 2:
Compute AT=0, level=1, fan-in set={2} for queued node 2F.O1, resetting "pending AT" mark. Note that node 2F.O1 is where the local loop in partition 2 was cut and it has no predecessors. Therefore the AT is assumed to be 0 and the level is assigned to be 1.
  2B.I3 is a successor of 2F.O1. Since all predecessors of 2B.I3 have ATs computed, all necessary information to determine a timing value for this node is available. Also, it has "pending AT" set, so no arrival time has been computed yet. Therefore., 2B.I3 is queued for propagation. Compute AT=1, level=2, fan-in set={2} for queued node 2B.I3, resetting "pending AT" mark.
  2B.O1 is a successor of 2B.I3. No ATs have been computed for 2B.I1 and 2B.I2 yet so all predecessors of 2B.O1 do not have ATs computed, so wait until these values are available. No more points are queued for propagation, so process 2 would optimally begin global loop detection Propagation would continue in process 1:
Compute AT=0, level=1, fan-in set {1} for queued node 1I2, resetting "pending AT" mark.
  1B.I1 is a successor of 1I2. Since all its predecessors have ATs computed and it has "pending AT" set, queue it for propagation.
Compute AT=0, level=2, fan-in set={1} for queued node 1B.I1, resetting "pending AT" mark. 1B.O1 is a successor of 1B.I1. Since all its predecessors have ATs computed and it has "pending AT" set, queue it for propagation.
Compute AT=1, level=3 fan-in set={1} for queued node 1B.O1, resetting "pending AT" mark.
  1A.I2 is a successor of 1B.O1. Since all its predecessors have AT's computed and it has "pending AT" set, queue it for propagation.
  1O2 is another successor of 1B.O1. Since all its predecessors have AT's computed and it has "pending AT" set, queue it for propagation.
Compute AT=1, level=4, fan-in set={1} for queued node 1A.I2, resetting "pending AT" mark.
  1A.O1 in a successor of 1A.I2. All its predecessors do not have ATs computed, so do nothing.
Compute AT=1, level=4, fan-in set={1} for queued node 1O2, resetting "pending AT" mark. Since a request, R2, is pending from process 2 for this value, it is sent to process 2.

No more points are queued for propagation, so process 1 would begin loop detection.

Note that after computation of values on node 1B.O1, nodes 1A.I2 and 1O2 are both queued for propagation. On a multi-processor computer the computation of values on these two points could take place simultaneously on different processors, so-called thread-based parallel timing analysis. In general, any time that multiple points are queued for propagation, their values could be computed simultaneously in different execution threads.

Once process 2 receives the value for 1O2 from process 1, it applies it to node 2I2 and continues propagation.
In process 2:
Compute AT=1, level=5, fan-in set={1,2} for queued node 2I2, resetting "pending AT" mark.
  2B.I2 is a successor of 2I2. Since all its predecessors Have As computed and it has "pending AT" set, queue it for propagation.
  2C.I1 is another successor of 2I2. Since all its predecessors have ATs computed, but it does not have "pending AT" set, it may optionally be queued for low priority propagation.
Compute AT=1, level=6, fan-in set={1,2} for queued node 2B.I2, resetting "pending AT" mark.
  2B.O1 is a successor of 2B.I2. All its predecessors do not have ATs computed, so do nothing.

No more points are queued for propagation, so process 2 would again begin loop detection.

At this point neither process 1 nor 2 has anything to do. Process 2 could optionally begin propagation of nodes in its low priority queue, beginning with node 2C.I1, but this will not be shown here.

Next, both processes will proceed to the global loop detection step. Process 2 may have begun this step before receiving a response to request R1 for the value on 1O2 from process 1, but global loop detection would have been suspended when the request was answered. To resolve the ambiguity between an output pin in one process and the input pin(s) in other processes which it feeds, all maps will be constructed using the names of the output pins feeding a cross-process connection. Establishment of this equivalence could be accomplished by various means, one example being the method described in U.S. Pat. No. 5,602,754 Beatty et. al.

Process 1 constructs an I/O map with connection 2O1-1O1. Input 1I2 and output 1O2 are omitted from the I/O map because values have already been computed for them, therefore they cannot be involved in any global loop. This map is sent to neighboring process 2.

Meanwhile process 2 constructs an I/O map with connections 1O1-2O1 and 1O1-2O2. Input 2I2 is omitted from the I/O map because a value has already been computed for it. Inputs 2I3 and 2I4 and outputs 2O3 and 2O4 are omitted because no request is pending for them, i.e., "pending AT" is not set on them. These nodes may be involved in loops, but these loops do not need to be broken to satisfy any requests. This map is sent to neighboring process 1.

When process 2 receives the I/O map from process 1, it merges it with its own map resulting in a map with connections 2O1-1O1-2O1 and 2O1-1O1-2O2. Because the first of these connections has the same start and end point, it represents a global loop. Process 2 then sends a message to all processes involved in the loop, processes 1 and 2, requesting them to submit a trial break point in their portion of the loop.

Meanwhile, process 1 will receive the map from process 2 and merge it with its own map in a similar manner, detecting the same loop. Assume that process 2 sends its request to break the loop first. When process 1 receives this request it will discard the identical loop it detected since process 2 is already handling it.

Assume process 1 offers to break the loop between 1A.I1 and 1A.O1 and process 2 offers a better place to break it between 2A.I1 and 2A.O1. Node 2A.O1 would then be queued for propagation and the propagation would continue as follows in process 2:

Compute AT=0, level=1, fan-in set={2} for queued node 2A.O1, resetting "pending AT" mark.
   2B.I1 is a successor of 2A.O1. Since all its predecessors have ATs computed and it has "pending AT" set, queue it for propagation.
   2O1 is another successor of 2A.O1. Since all its predecessors have ATS computed and it has "pending AT" set, queue it for propagation.
Compute AT=0, level=2, fan-in set={2} for queued node 2O1, resetting "pending AT" mark. Since a request, R3, is pending from process 1 for this value, send it to process 1.
Compute AT=0, level=2, fan-in set={2} for queued node 2B.I1, resetting "pending AT" mark
   2B.O1, is a successor of 2B.I1. Since all its predecessors have ATs computed and it has "pending AT. set, queue it for propagation.
Compute AT=2, level=7, fan-in set={1,2} for queued node 2B.O1, resetting "pending AT" mark.
   2O2 is a successor of 2B.O1. Since all its predecessors have ATS computed and it has "pending AT" set, queue it for propagation.
   2F.I1 is another successor of 2B.O1 Since all its predecessors have AT's computed and it has "pending AT" set, queue it for propagation.

Compute AT=2, level=8. fan-in set={1,2} for queued node 2F. I1, resetting "pending AT" mark.
Compute AT=2, level=8, fan-in set={1,2} for queued node 2O2, resetting "pending AT" mark.
An AT is now available for node 2O2, so this value is returned to the requesting application.

No more points are queued for propagation, and there are no more requests for timing valves pending at any partition inputs, so this process is finished for now.

In process 1, node 1I1 would be queued when the value from 2O1 was received and propagation would continue as follows:

Compute AT=0, level=3, fan-in set={1,2} for queued node 1I1, resetting "pending AT" mark. 1A.I1 is a successor of 1I1. Since all its predecessors have ATs computed and it has "pending AT" set, queue it for propagation.
Compute AT=0, level=4, fan-in set={1,2} for queued node 1A.I1, resetting "pending AT" mark.
   1A.O1 is a successor of 1A.I1. Since all its predecessors have ATs computed and it has "pending AT" set, queue it for propagation.
Compute AT=2, level=5, fan-in set={1,2} for queued node 1A.O1, resetting "pending AT" mark.
   1O1 is a successor of 1A.O1. Since all its predecessors have ATs computed and it has "pending AT" set, queue it for propagation.
Compute AT=2, level=6, fan-in set={1,2} for queued node 1O1, resetting "pending AT" mark. Since a request is pending from process 2 for this value, send it to process 2. No more points are queued for propagation, so begin loop detection.

In process 2 node 2I1 would be queued when the value from 1O1 was received.
Compute AT=2, level=7, fan-in set={1,2} for queued node 2I1, resetting "pending AT" mark.
   2A.I1 is a successor of 2I1. Since all its predecessors have ATs computed and it has "pending AT" set, queue it for propagation.
Compute AT=2, level=8, fan-in set={1,2} for queued node 2A.I1 resetting "pending AT" mark.

No more points are queued for propagation, so begin loop detection.

Subsequent requests to get ATs at different points in the network might be issued and they would proceed in a manner similar to that above. The initial timing analysis phase is now completed.

Next, assume some application makes changes in one or more of the partitions, and requests feedback from the timing analyzer to evaluate those changes. Each process making such changes would notify its neighbors on whose values it depends that it is making such asynchronous updates, so that the neighbors would know they need to send unrequested updates after each complete network change.

Assume that some application in process 1 chooses to insert a buffer 1C between blocks 1B and 1A, and that an application in process 2 chooses to insert a buffer 2G between blocks 2A and 2B. The process of inserting a buffer will include the steps of adding the new buffer and its output net, disconnecting the sink pin from the old net, connecting the sink pin to the new buffer output, and connecting the buffer input to the old net. Insertion of a buffer is used only as an example here, in general the method would apply to any arbitrary network change which might be broken up into a series of steps.

Assume that process 1 makes its change first. Before making the change, process will "lock" the primary input values to prevent any changes made in other processes from affecting the timing update made due to its local network changes. The changes are deferred to allow the application making changes in process 2 to see the effects of its own change, without interference from other concurrent changes in other processes. This allows the application to better decide whether or not to keep the change it makes. Process 1 will also force the update of its output values and set them aside as "saved" values. The saved values are sent to any other process which requests timing values from process 1 while it is in the middle of making its updates. Process 1 will then proceed to make changes and request an updated AT at pin 1A.I1 to evaluate the effects of the change. This may be done according to the method in U.S. Pat. No. 5,508,937 to Abato et al., or some other incremental timing update method. Note that the Abato et. al. incremental update method establishes recalculation lists which contain multiple points pending recalculation. As in the case of the propagation queues above, when the recalculation list contains multiple nodes at the lowest level number, their values may be recalculated simultaneously in different execution threads. When the entire change is completed, process 1 will "unlock" its primary input values but since no pending updates are stored, these values will remain unchanged. It will then discard its saved output values and force the update of the timing values at the outputs, following the same incremental timing update method, and will send the updated values to process 2.

Now consider the case where process 2 starts its change before receiving the undated values from process 1. In this case it will also lock its primary input values, update and save its output values, and begin to make its changes. But before it is finished it will receive updated values from process 1. Because the input values are locked, these new values, at pins 2I1 and 2I2, are placed in a "pending update" slot on their corresponding pins, but are not factored into any incremental timing updates in process 2. When process 2 completes its change the PIs are unlocked and pending updates at the inputs which were received from process 1 are registered with the incremental timing update method. The saved output values are discarded and updated PO values are incrementally computed, factoring in the updated PI values. The updated output value on 2O1 is then sent to process 1.

If instead the updated values from process 1 were received before process 2 began its change, they would be applied directly to the pins rather than being stored in a "pending update" slot, and would be considered in the timing updates performed during the process 2 change.

Thus, we can make simultaneous multi-step changes in different partitions and have each process take into consideration all completed changes in other partitions when evaluating changes of its own, but not take into consideration partial changes which might give inconsistent results. Each process also sees a stable timing environment while making its own change, thus allowing it to isolate the effect of the change it is trying to make and evaluate.

The simultaneous changes have now all been made and some application then requests a completely up to date AT value on some nodes, 1A.I1 and 1A.I2. Because node 1A.I2 has only partition 1 in its fan-in set, no requests for updated values need to be sent to other processes, and an updated value can be computed locally using the method of Abato et. al. However, node 1A.I1 has both partition 1 and 2 in its fan-in set. Therefore a request is sent to process 2 to update its values for fan-in set {1,2} up to level number 4, the level number of node 1A.I2.

Next, process 1 and 2 both begin to locally execute the timing update method of Abato et. al. When an updated value in process 2 is computed on its output 2O2, this value is sent to process 1 which enters the new value into its recalculation list and continues. Note that if other changes are pending in process 2 on nodes whose fan-in set includes partition 3 (e.g., 2C.O1), these need not be recalculated at this time because they cannot affect the times on a node with fan-in set {1,2}.

When process 2 has completed all its updates it sends a message to process 1 indicating that fact. It also informs process 1 of how many updated values it has sent and to which other processes. In this case the updates in process 2 did not include any new values propagated from other processes, but in general process 2 would also tell process 1 how many updates it had received and from which processes. By having other processes notify the requester which updates it has sent and received, the requester can be certain that all changes have been accounted for. Otherwise some process X might inform the requester that it has finished processing all updates before it has received an update from process Y. When process Y tells the requester it has also finished processing all updates the requester will believe all timing updates have been made, while in fact process X now needs to process the new updates it received from process Y. Thus, a process may send multiple completion messages to the requester if new updates arrive after all local updates have been completed.

It is well known to those skilled in the art that computation of required arrival times can be performed in a manner similar to the computation of arrival times, with the roles of predecessors and successors, in-edges and out-edges, and inputs and outputs reversed. Accordingly, the invention will be understood to include a similar method for commutation of required arrival times. The concepts presented may also be used for distributed computation of other values propagated forward or backward through a logic network (or any other directed graph) such that the value at a point in the graph depends only on the values of the points and edges feeding (fed by) it. Examples include static analysis of signal noise levels in a circuit, computation of simulation values, controllability and observability information used in test generation and logic synthesis, the MSPF (maximum set of permissible functions) and CSPF (compatible set of permissible functions) used in the transduction method of logic synthesis, all of which are known to one skilled in the art.

Accordingly, a method of distributed static timing analysis for a network which has been partitioned into at least two partitions with each partition being assigned to a separate analysis process has been provided. The method can also detect and cut global loops and provide updated timing information when a change is made to the network.

While a preferred embodiment of the invention has been described above, since variations in the invention will be apparent to those skilled in the art, the invention should not be construed as limited to the specific embodiment described above.

What is claimed is:

1. A method of performing a distributed static timing analysis of a network of logic circuits comprising interconnected predecessor nodes and successor nodes, wherein predecessor nodes provide signals characterized by timing values to successor nodes, said method comprising the steps of:

partitioning said network into a plurality of partitions, each partition comprising a subset of said predecessor and successor nodes;

executing a separate timing analysis process for each of said partitions, each of said processes executing substantially in parallel; and issuing, to at least a first of said processes corresponding to a first partition containing a successor node, a first request for timing information for said successor node, wherein said first request initiates a depth-first search (DFS) on predecessor nodes of said successor node to respond to said first request, said DFS recursively executing on each of said predecessor and successor nodes only once for said first request, and wherein computation and propagation of timing values are performed subsequently to said DFS.

2. The method of claim 1, wherein said DFS generates, to at least a second process corresponding to a second partition containing a first predecessor node of said successor node, a second request for timing information for said first predecessor node.

3. The method of claim 1, wherein said first request generates a plurality of timing value computation processes for computing signal timing values for a plurality of predecessor nodes of said successor node, said plurality of timing value computation processes executing substantially in parallel.

4. The method of claim 3, wherein said timing value computation processes execute as threads of said first process.

5. The method of claim 1, wherein said first partition includes a loop, and said DFS detects and breaks said loop.

6. The method of claim 1, said DFS comprising the steps of:

setting a first status marker on said successor node to indicate that a request for timing information has been issued;

performing a recursive traversal of said successor node and those of its predecessor nodes within said first partition, said recursive-traversal comprising the steps of:

requesting timing information for said predecessor nodes within said first partition; and setting said first status marker on said predecessor nodes of said successor node within said first partition for which timing information is requested;

wherein during a recursion of said traversal, timing information is requested only from nodes for which said first status marker is not set.

7. The method of claim 1, said DFS comprising the step of setting a second status marker on said successor node to indicate that a branch of said network connected to said successor node is being traversed by said DFS, wherein said first process uses said second status marker to determine whether a local loop exists in said first partition.

8. The method of claim 1, further comprising performing an incremental timing update to reflect a change to any partition of said plurality of partitions.

9. The method of claim 8, further comprising the steps of:

for a changed partition, assigning a bit flag to each other partition of said plurality of partitions that includes a predecessor node of a successor node in said changed partition;

setting said assigned bit flags on said successor node in said changed partition;

requesting timing updates associated with said changed partition only from partitions whose bit flag was set on said successor node in said changed partition.

10. A method of performing an incremental timing update in a distributed static timing analysis of a network of logic circuits comprising interconnected nodes, comprising the steps of:

partitioning said network into a plurality of partitions, each partition including a subset of said nodes;

assigning each of said partitions to a separate process for determining timing values for nodes in each partition;

introducing a change to a partition, wherein said change has an effect on said timing values;

inhibiting inputs affecting timing values from processes associated with partitions different from said changed partition;

analyzing the effects of a change in one of said different partitions while said inhibition is active;

performing an incremental update, corresponding to said change, of the timing values for said changed partition;

after said incremental update is performed, releasing said inhibited inputs, processing said inputs; and outputting timing values resulting from said processing step to processes of related partitions.

11. A method for detecting global loops in a network of logic circuits comprising interconnected nodes, during a distributed static timing analysis of said network, said method comprising the steps of:

dividing said network into at least first and second partitions, said network including a global loop between said first and second partitions;

performing first and second processes for determining timing values for nodes in said first and second partitions, respectively;

establishing a communication mechanism between said first and second processes; and using said communication mechanism to detect and break said global loop, to determine timing values for nodes included in said global loop.

12. The method of claim 11, wherein said communication mechanism comprises exchanging a map of connections between said first and second partitions.

13. The method of claim 12, wherein said first and second processes determine from said exchange of maps whether said connections form a loop.

14. The method of claim 11, wherein said first and second processes negotiate to determine an optimal point for breaking said global loop.

15. The method of claim 12, wherein said first and second processes each exchange said map with each of processes associated with neighboring partitions.

16. A computer-usable medium storing computer-executable instructions, said instructions when executed implementing a process of distributed static timing analysis of a network of logic circuits comprising interconnected predecessor nodes and successor nodes, wherein predecessor nodes provide signals characterized by timing values to successor nodes, said process comprising the steps of:

partitioning said network into a plurality of partitions, each partition comprising a subset of said predecessor and successor nodes;

executing a separate timing analysis process for each of said partitions, each of said processes executing substantially in parallel; and issuing, to at least a first of said processes corresponding to a first partition containing a successor node, a request for timing information for said successor node, wherein said first request initiates a depth-first search (DFS) of predecessor nodes of said successor node to respond to said request.

17. A program storage device readable by a machine, tangibly embodying a program of instructions executable by the machine to perform method steps of distributed static timing analysis of a network of logic circuits comprising interconnected predecessor nodes and successor nodes, wherein predecessor nodes provide signals characterized by timing values to successor nodes, said method steps comprising:

partitioning said network into a plurality of partitions, each partition comprising a subset of said predecessor and successor nodes;

executing a separate timing analysis process for each of said partitions, each of said processes executing substantially in parallel; and issuing, to at least a first of said processes corresponding to a first partition containing a successor node, a request for timing information for said successor node, wherein said request initiates a depth-first search (DFS) of predecessor nodes of said successor node to respond to said request.

* * * * *